(12) United States Patent
Jarabek et al.

(10) Patent No.: US 7,246,289 B2
(45) Date of Patent: Jul. 17, 2007

(54) MEMORY INTEGRITY SELF CHECKING IN VT/TU CROSS-CONNECT

(75) Inventors: Andrew Jarabek, Ontario (CA); Aris Tombul, Ontario (CA); Warren Lau, Ontario (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 420 days.

(21) Appl. No.: 10/675,097

(22) Filed: Sep. 30, 2003

(65) Prior Publication Data

US 2005/0071718 A1    Mar. 31, 2005

(51) Int. Cl.
*G01R 31/28* (2006.01)
(52) U.S. Cl. .................... 714/736; 714/719
(58) Field of Classification Search ............ None
See application file for complete search history.

(56) References Cited

U.S. PATENT DOCUMENTS

| | | | | |
|---|---|---|---|---|
| 3,596,245 A | * | 7/1971 | Finnie et al. | 714/707 |
| 3,892,955 A | * | 7/1975 | Maejima | 714/736 |
| 3,927,371 A | * | 12/1975 | Pomeranz et al. | 714/740 |
| 4,084,262 A | * | 4/1978 | Lloyd et al. | 714/47 |
| 4,097,797 A | * | 6/1978 | Finet | 714/736 |
| 4,171,765 A | * | 10/1979 | Lemone | 714/719 |
| 4,454,600 A | * | 6/1984 | LeGresley | 714/757 |
| 5,289,178 A | * | 2/1994 | Schwendeman | 340/7.58 |
| 6,388,920 B2 | * | 5/2002 | Katayama et al. | 365/185.09 |
| 6,928,607 B2 | * | 8/2005 | Loaiza et al. | 714/807 |
| 7,036,059 B1 | * | 4/2006 | Carmichael et al. | 714/725 |

* cited by examiner

*Primary Examiner*—Guy Lamarre
*Assistant Examiner*—Steven D. Radosevich
(74) *Attorney, Agent, or Firm*—Shin Hung; Borden Ladner Gervais LLP

(57) ABSTRACT

A method and apparatus for detecting errors in a memory includes generating a first check word based on incoming data and generating a second check word based on stored data. The method includes comparing the first check word to the second check word, generating a comparison result, and indicating a failure based on the comparison result.

22 Claims, 4 Drawing Sheets

MEMORY INTEGRITY SELF CHECKING IN VT/TU CROSS-CONNECT

BACKGROUND

This invention relates to detecting errors in a memory.

Synchronous data communications networks can carry payload data using, for example, the synchronous digital hierarchy (SDH) protocol or synchronous optical network (SONET) protocol. In each of these protocols, payload data is transported within synchronous payload envelopes (SPE's), in which the payload data is organized into rows. Typically, each row is subdivided into a plurality of data segments, each of which may comprise one or more bytes of data. Lower order signals, which are mapped into columns in the SPE, may be re-arranged one row at a time through a cross-connect device.

In a cross-connect device, it is useful to monitor the data switched through the device to ensure the data is not corrupted. In systems that support a redundant back-up system, detection of corrupted data can be used to trigger a switch-over to a back-up system.

SUMMARY

In one aspect the invention features a method and apparatus for detecting errors in a memory. The method includes generating a first check word based on incoming data and generating a second check word based on stored data. The method includes comparing the first check word to the second check word, generating a comparison result, and indicating a failure based on the comparison result.

In another aspect the invention features a method and apparatus for detecting errors in a memory. The method includes generating a first check word based on incoming data to a subset of a plurality of memories, reading a set of data stored in the subset of the memories, and generating a second check word based on the set of data. The method also includes comparing the first check word to the second check word, generating a comparison result, and indicating a failure based on the comparison result. The method can also include reading data from multiple memories simultaneously.

One or more of the following features may also be included. The second check word is generated at a time subsequent to the data being stored and prior to the data being overwritten. The second check word is generated during periods of time when the device storing the data is in an idle state. The generation of the second check word is synchronized to the reading and writing of the data. The generation of the second check work may include reading bytes from a selected set of memory locations. The selected set of memory locations may include memory locations included in a single memory or memory locations included in multiple memories. The method may include reading the multiple memories simultaneously. The first check word is stored in a write accumulator and the second check word is stored in a read accumulator.

One or more aspects of the invention may provide one or more of the following advantages.

The data memory self-check provides fault detection and a switchover to a back-up system improving the overall reliability of a system and network. The RAMs are efficiently audited for errors in the background without modifying the data being cross-connected or limiting the integrity checking to the memory locations being read in the foreground for the purposes of switching the data. The technique may detect soft errors and/or memory failures due to ASIC faults or invalid operating conditions.

If the memories are partitioned in such a way that when one memory is being written one or more of the other memories are available for reading, it is possible to read at least two memories simultaneously. A checking algorithm allows for sequential computation of the check-word in the background while data is being input into the memories and parallel computation when the data is read back out, thus, reducing the interval of time between writing and checking the integrity of the data by reading it back. An increase in checking frequency means that error coverage is improved and error detection time is reduced, which may improve overall reliability of a system by enabling it to quickly switch over to a redundant backup switch.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
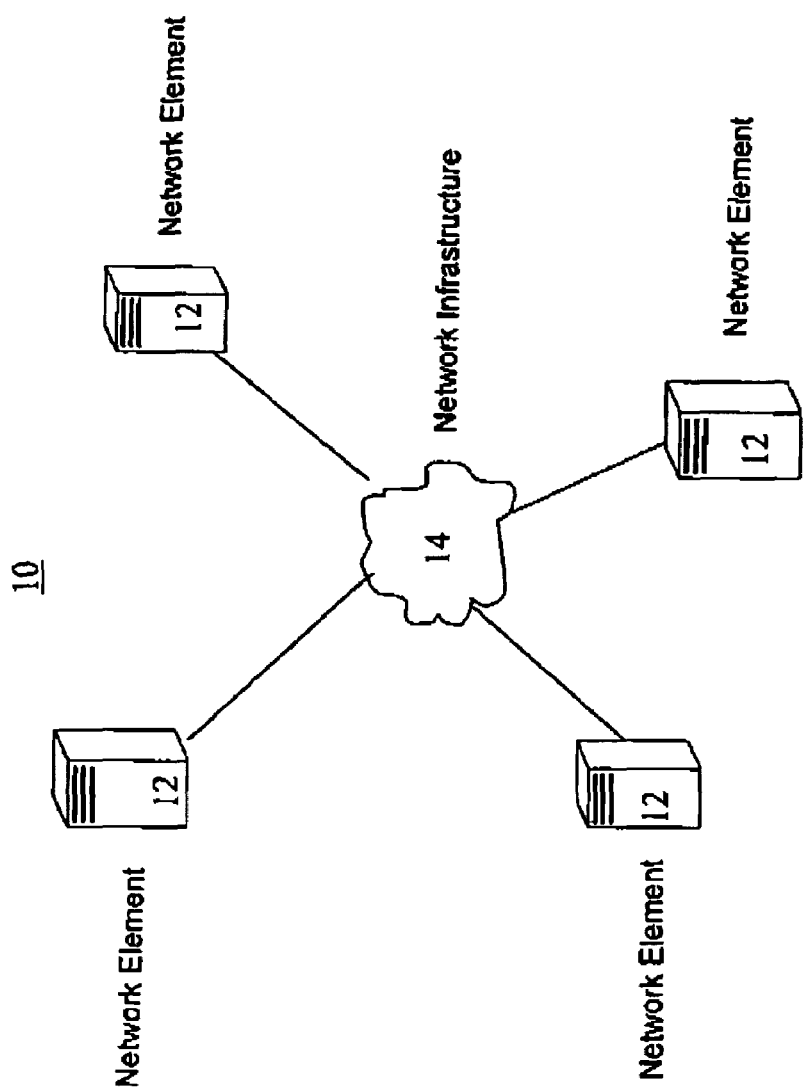
FIG. 1 is a block diagram of a network.

Referring to FIG. 1, a network 10 includes a plurality of network elements 12 in communication with each other via a network infrastructure 14. The network infrastructure 14 may include network elements or nodes, and/or sub-networks. The network elements include synchronous transmission apparatus such as a multiplexer, a regenerator, or a cross-connect (not shown). In one example, the network 10 can be a SONET and/or SDH network. Network elements 12 in network 10 switch data traffic. The network element 12 monitors data switched through the element to ensure that the data is not corrupted. If the system includes a redundant back-up system, detection of corrupted data triggers a switchover to the back-up system.

An application specific integrated circuit (ASIC) provides cross-connection and protocol conversion functions. The ASIC includes random access memory (RAM) that provides a cross-connection between a plurality of input ports and a corresponding plurality of output ports. An associated core logic controls the writing of incoming data to the RAM and subsequent reading of outgoing data from the RAM to provide cross-connection, format conversion, and channel reordering functionality.

Figure 2:
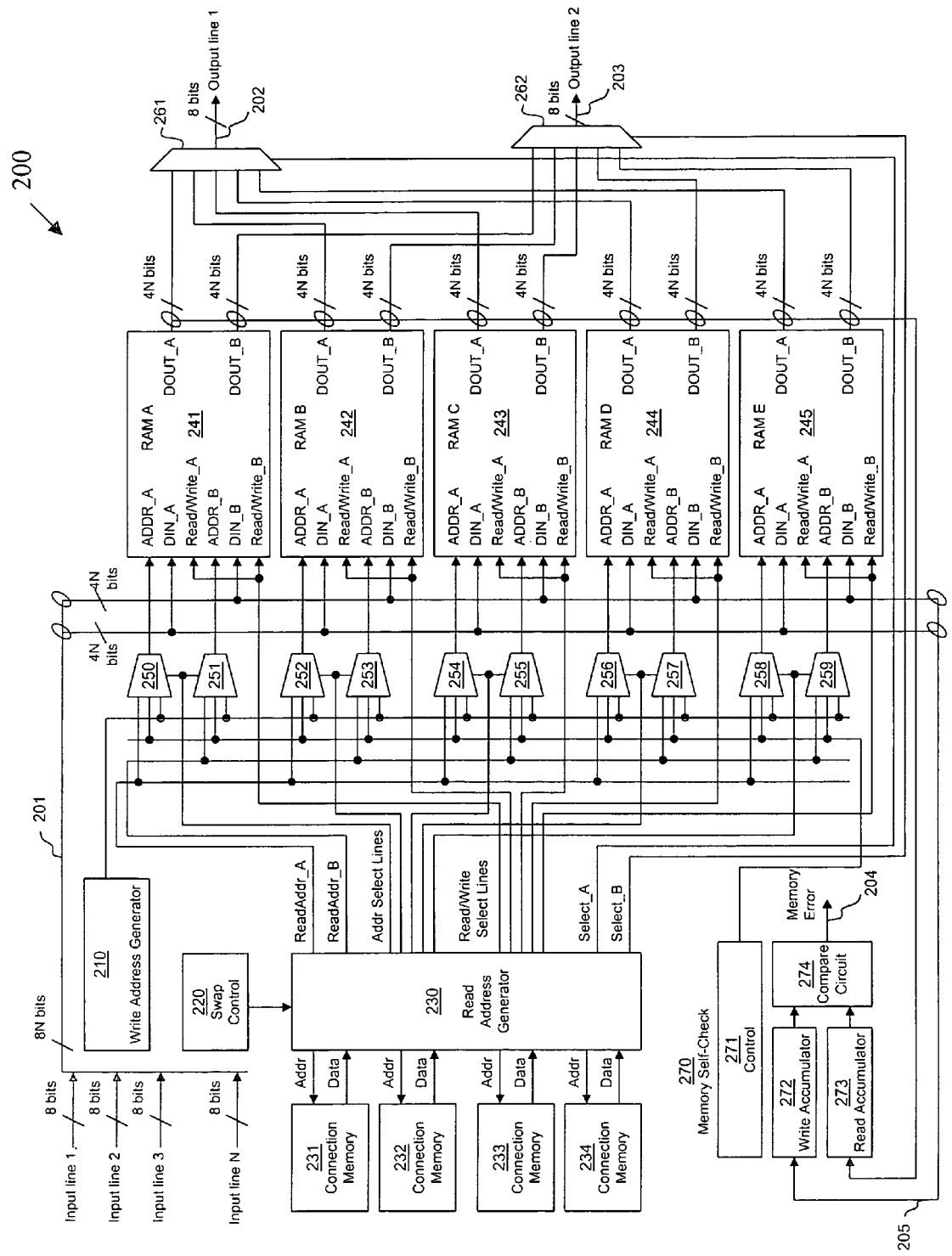
FIG. 2 is a block diagram of a switching core in a VT/TU cross-connect.

Referring to FIG. 2, a slice of the switching core 200 includes a data memory self-check circuit 270. The switching core includes a set of random access memories (RAMs) 241, 242, 243, 244, and 245. The switching core 200 uses random access memories (RAMs) to switch data. A write address generator 210 controls the writing of data inputs aggregated into line 201 into RAMs 241, 242, 243, 244 and 245. A connection RAM 231 and 233 controls the reading out of the data RAMs 241, 242, 243, 244, and 245. Connection RAMs 232 and 234 may also be selected by read address generator 230 for the purpose of read data out of the data RAMs. The data memory self-check circuit 270 includes a control block 271, a write accumulator 272, a read accumulator 273, a compare circuit 274, and an output 204. The data memory self-check circuit 270 checks the integrity of the data stored in RAMs 241, 242, 243, 244, and 245 and outputs an error signal to output 204 if the data is corrupted. The slice of the switching core 200 also includes other blocks to manage the switching of data. For example, the switching core 200 may include a swap control module 220 and multiplexers 250-259 and multiplexers 261-262.

Figure 3:
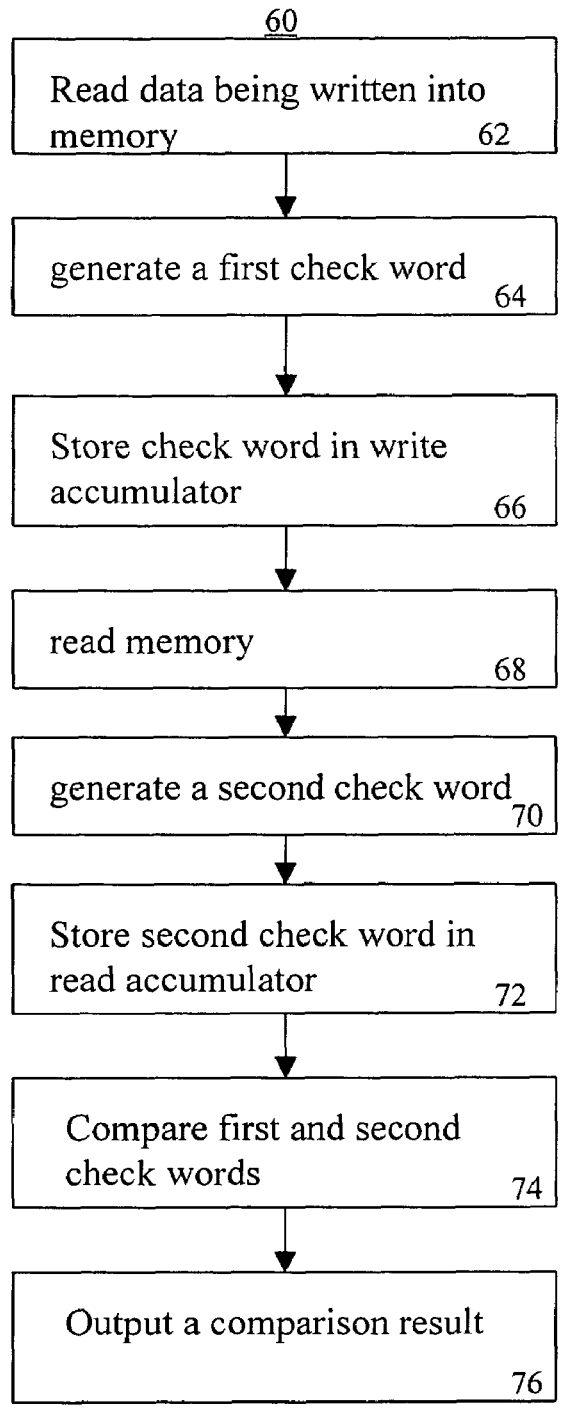
FIG. 3 is a flow chart of a process for detecting errors in a memory.

Referring to FIG. 3, a process 60 includes reading (62) data a while the SONET/SDH frames flow into the data memories (i.e. RAMs 241, 242, 243, 244, and 245). In one example, the data input line 201 is tapped by a data line 205 and process 60 reads the data from the data in line 205. Process 60 generates (64) a first check work based on specific bytes of data lines 205 and stores (66) the check word in a write accumulator 272. Subsequent to storing the data in the RAMs 241, 242, 243, 244, and 245, process 60 reads (68) selected memories and locations of the memory associated with the bytes of data used to generate the first check word. Reading of data for check word generation is synchronized to reading and writing of the data to the RAMs 241, 242, 243, 244, and 245. For example, reading for check word generation is synchronized such that reading of the data for generation of a check word occurs during idle times. For accurate check word generation, the reading occurs before the data is overwritten. Process 60 generates (70) a second check word based on the data read from the memories and stores (72) the second check word in a read accumulator 273. Process 60 compares (74) the contents of the write accumulator 46 and the read accumulator 273 using compare circuit 274. Process 60 outputs (76) a signal based on the comparison. If the check words do not match, the signal alarms the host processor indicating a failure via output line 204.

For example, a string of data being written into RAM A 241 is (in hexadecimal) 'F6, 28, 01', this data is read to generate a first check work. If byte interleaved parity (similar to the BIP-8 algorithm used in SONET and SDH for computing the B1 overhead byte) is used to generate the check word, then the first check word would equal hexadecimal 'DF'. Subsequently, the data is read from the memory for the generation of the second check word. Again, the data memory self check circuit 270 uses the BIP-8 algorithm to compute the check word in read accumulator 273. If the data has been stored and maintained correctly in RAM A, the data memory self check circuit generates a second check word of hexadecimal 'DF'. Thus, when compared the first check word, the second check word 'DF' is equivalent to the first check word 'DF'. On the other hand, if the data is corrupted, for example the second most significant bit of the first byte being flipped forming the string 'B6, 28, 01', the data memory self-check circuit 270 would generate a second check word of 'CF'. When compared to the first check word 'DF' the compare circuit 274 would detect a difference and thus output an error signal. While in this example the data memory self-check circuit 270 generates the check words using the algorithm BIP-8 other algorithms can be used. Several algorithms based on cyclic redundancy checks (CRC) could be adapted for this purpose.

Accesses to RAMs 241, 242, 243, 244, and 245 are synchronized such that the data memory self-check circuit 270 does not interfere with writes and reads required for the data path (switching function). The data memory self-check circuit 270 is synchronized to the write address generator 210 and read address generator 230 such that read accesses occur when data path accesses are not required.

Figure 4:
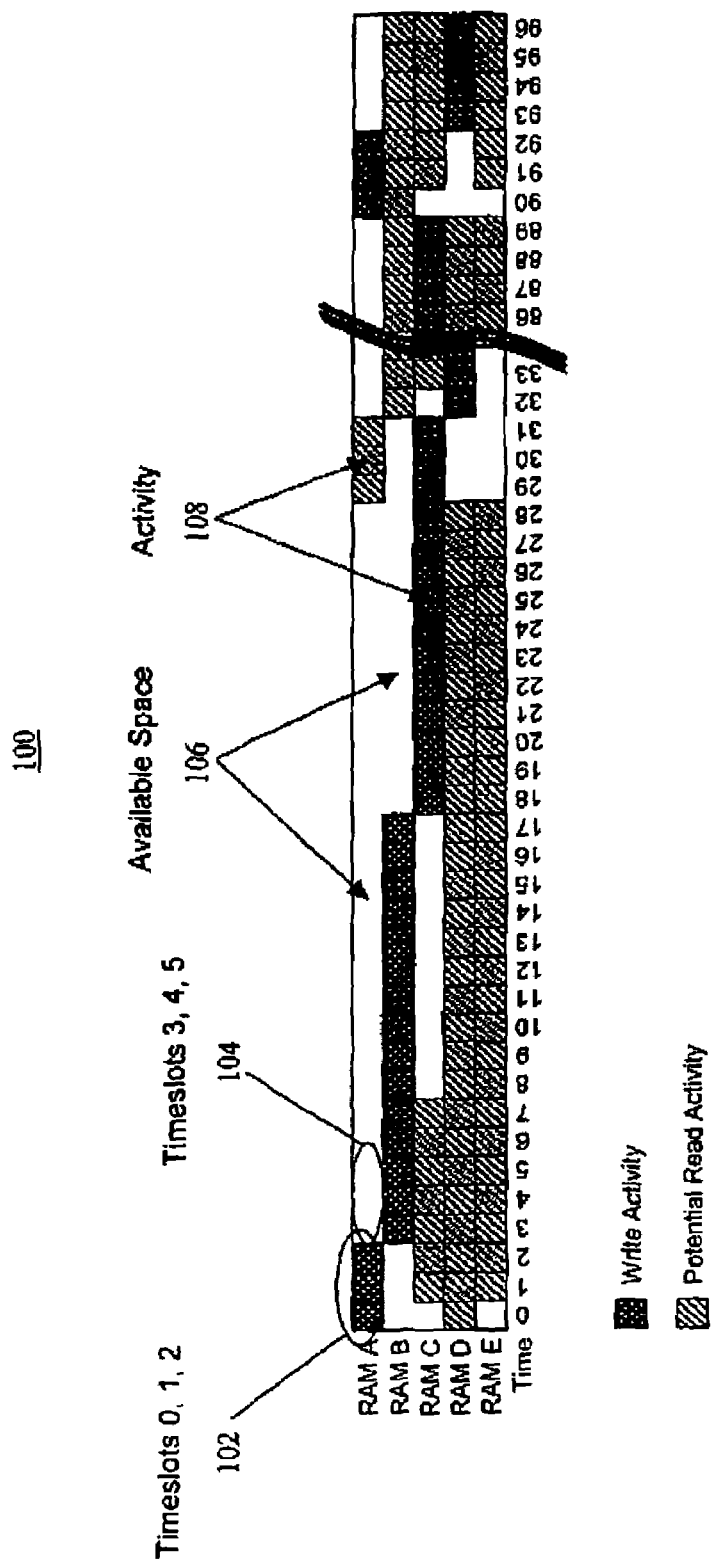
FIG. 4 is a block diagram of write and read activity for the RAMs.

FIG. 4 shows an example of the write and read activity for each of the five RAMs 241, 242, 243, 244, and 245. The shaded or hashed spaces 108 indicate timeslots when data is being written to or read from RAMs 241, 242, 243, 244, and 245. The white space 106 in the graph shows the timeslots in which the data memory self-check circuit 270 could take control of RAMs 241, 242, 243, 244, and 245 for the purpose of checking the validity of the contents previously written.

In one example, check-word information accumulates in the write accumulator while a series of bytes are written into "RAM A" 241 during the zero, first, and second timeslots 102. A second check word is generated by reading the data stored in "RAM A" 241 during the third, fourth, and fifth timeslots 104. The first check word stored in a write accumulator 272 and the second check word stored in a read accumulator 273 are subsequently compared. In subsequent cycles, the data memory self check circuit 270 checks other memory locations in a similar fashion.

In another example, the data memory self-check circuit 270 takes control of one or more of the memories via multiplexers 250 to 259 while specific SONET/SDH overhead bytes are input on input line 201. Typically, the SONET/SDH A1 and A2 bytes are regenerated by the switch device in a circuit downstream from output lines 202 and 203. Since the A1 and A2 overhead bytes are always typically hexadecimal 'F6' and '28' respectively in a SONET/SDH system, it is not important to switch them through a VT/TU cross-connect. "Stealing" the timeslots that would have been used to write these bytes to the memory, frees up time for the data memory self-check circuit 270 to read locations in RAMs 241, 242, 243, 244, and 245 without affecting the switched data. In this example, unique data is written every 61 timeslots to 61 memory locations for each STS-1 stream. If only the A1 and A2 byte timeslots are used for the purpose of checking the memory contents would require 31 frames to verify all 61 memory locations. In order to improve efficiency, the data memory self-check simultaneously applies the read to multiple memories at the same time. As long as RAMs 241, 242, 243, 244, and 245 are partitioned in such a way that when one memory is being written the others are available for reading, it is possible to read at least two memories simultaneously. If the checking algorithm allows for parallel computation of the check-word, the number of frames required to check the memory is reduced. In one example, the number of frames required to check the entire memory can be reduced from 31 to 16 by reading two memories simultaneously.

While in the examples related to FIGS. 1-4, the slice of the switching core 200 includes five RAMs the number of RAMs can be modified to customize the switching core to specific needs.

A number of embodiments of the invention have been described. Nevertheless, it will be understood that various modifications may be made without departing from the spirit and scope of the invention. Accordingly, other embodiments are within the scope of the following claims.

What is claimed is:

1. A method for detecting an error in a memory storing incoming data as stored data, including:

Generating and storing a first check word in a write accumulator based on the incoming data;

Generating and storing a second check work in a read accumulator based on the stored data;

Comparing the first check word to the second check word by way of a compare circuit connected to the write accumulator and the read accumulator;

Generating a comparison result; and

Indicating a failure based on the comparison result.

2. The method of claim 1 wherein generating the second check word occurs at a time subsequent to the data being stored and prior to the data being overwritten.

3. The method of claim 1 further comprising: generating the second check word during periods of time when the device storing the data is in an idle state.

4. The method of claim 1 further comprising: synchronizing the generation of the second check word to the reading and writing of the data.

5. The method of claim 1 wherein generating the second check word further comprises reading bytes from a selected set of memory locations.

6. The method of claim 5 wherein the selected set of memory locations includes memory locations included in a single memory.

7. The method of claim 5 wherein the selected set of memory locations includes memory locations included in multiple memories.

8. The method of claim 7 further comprising reading the multiple memories simultaneously.

9. A method for detecting an error in a subset of a plurality of memories storing incoming data as a set of data, comprising:

generating and storing a first check word in a write accumulator based on the incoming data provided to the subset of a plurality of memories;

reading the set of data store in the subset of the plurality of memories;

generating and storing a second check word in a read accumulator based on the set of data read;

comparing the first check word to the second check word by way of a compare circuit connected to the write accumulator and the read accumulator;

generating a comparison result; and indicating a failure based on the comparison result.

10. The method of claim 9 wherein reading a set of data stored in the predetermined subset of the memories includes reading data from multiple memories simultaneously.

11. A computer program product tangibly embodies on a computer readable medium, for checking contents of a memory storing incoming data as stored data in a network switching environment comprising instructions for causing a computer to:

generate and store a first check word in a write accumulator based on the incoming data;

generate and store a second check word in a read accumulator based on the stored data;

compare the first check word to the second check word by way of a compare circuit connected to the write accumulator and the read accumulator;

generate a comparison result; and indicate a failure based on the comparison result.

12. The computer program product of claim 11 further comprising instructions to: generate the second check word at a time subsequent to the data being stored and prior to the data being overwritten.

13. The computer program product of claim 11 further comprising instructions to: generate the second check word during periods of time when the device storing the data is in an idle state.

14. The computer program product of claim 11 further comprising instructions to: synchronize the generation of the second check word to the reading and writing of the data.

15. The computer program product of claim 11 further comprising instructions to: generate the second check word by reading bytes from a selected set of memory locations.

16. The computer program product of claim 11 further comprising instructions to: generate the second check word by reading bytes simultaneously from multiple memory locations.

17. A computer program product tangibly embodied on a computer readable medium, for checking contents of a set of memories in a switching environment comprising instructions for causing a computer to:

Store incoming data in a predetermined subset of memories as a set of data;

Generate and store a first check word in a write accumulator based on the incoming data provided to the predetermined subset of the memories;

Read the set of data stored in the predetermined subset of memories;

Generating and storing a second check word in a read accumulator based on the set of data read;

Compare the first check word to the second check word by way of a compare circuit connected to the write accumulator and the read accumulator;

Generate a comparison result; and

Indicate a failure based on the comparison result.

18. The computer program product of claim 17 further comprising instructions to: generate the second check word at a time subsequent to the data being stored and prior to the data being overwritten.

19. The computer program product of claim 17 further comprising instructions to: generate the second check word during periods of time when the device storing the data is in an idle state.

20. The computer program product of claim 17 further comprising instructions to: synchronize the generation of the second check word to the reading and writing of the data.

21. The computer program product of claim 17 further comprising instructions to: generate the second check word by reading bytes from a selected set of memory locations.

22. The computer program product of claim 17 further comprising instructions to: generate the second check word by reading bytes simultaneously from multiple memory locations.

* * * * *

UNITED STATES PATENT AND TRADEMARK OFFICE
CERTIFICATE OF CORRECTION

| | |
|---|---|
| PATENT NO. | : 7,246,289 B2 |
| APPLICATION NO. | : 10/675097 |
| DATED | : July 17, 2007 |
| INVENTOR(S) | : Andrew Louis Jarabek et al. |

Page 1 of 1

It is certified that error appears in the above-identified patent and that said Letters Patent is hereby corrected as shown below:

Column 5, claim 11, line 44, delete "embodies" and insert therefore -- embodied --;

Column 6, claim 17, line 23, delete "of" and insert therefore -- of the --; and

Column 6, claim 17, line 25, delete "generate and store" and insert therefore -- generating and storing --.

Signed and Sealed this

Fourth Day of December, 2007

JON W. DUDAS
*Director of the United States Patent and Trademark Office*